(12) United States Patent
Philipp

(10) Patent No.: US 8,643,626 B2
(45) Date of Patent: Feb. 4, 2014

(54) CLOSED PATH CAPACITIVE POSITION SENSOR

(75) Inventor: Harald Philipp, Southampton (GB)

(73) Assignee: Atmel Corporation, San Jose, CA (US)

( * ) Notice: Subject to any disclaimer, the term of this patent is extended or adjusted under 35 U.S.C. 154(b) by 1 day.

(21) Appl. No.: 13/495,158

(22) Filed: Jun. 13, 2012

(65) Prior Publication Data

US 2012/0313892 A1    Dec. 13, 2012

Related U.S. Application Data

(63) Continuation of application No. 10/916,744, filed on Aug. 12, 2004, now Pat. No. 8,217,915.

(60) Provisional application No. 60/496,939, filed on Aug. 12, 2003.

(51) Int. Cl.
*G06F 3/045* (2006.01)

(52) U.S. Cl.
USPC .......................................................... 345/174

(58) Field of Classification Search
USPC .................. 345/173, 174, 177, 178; 324/686; 341/31; 178/18, 19, 20, 18.01–18.07, 178/19.01, 20.01–20.04
See application file for complete search history.

(56) References Cited

U.S. PATENT DOCUMENTS

| | | | |
|---|---|---|---|
| 4,158,216 A | | 6/1979 | Bigelow |
| 4,264,903 A | * | 4/1981 | Bigelow ........................... 341/1 |
| 4,293,734 A | * | 10/1981 | Pepper, Jr. ................. 178/18.01 |
| 4,476,463 A | | 10/1984 | Ng et al. |
| 4,736,191 A | | 4/1988 | Matzke et al. |
| 4,761,546 A | | 8/1988 | Ikari et al. |
| 4,764,717 A | | 8/1988 | Tucker et al. |
| 5,008,497 A | * | 4/1991 | Asher ........................ 178/18.05 |
| 5,079,500 A | * | 1/1992 | Oswald ........................ 323/364 |
| 5,159,159 A | | 10/1992 | Asher |

(Continued)

FOREIGN PATENT DOCUMENTS

| | | |
|---|---|---|
| GB | 2050621 | 1/1981 |
| TW | 403860 | 1/2000 |

(Continued)

OTHER PUBLICATIONS

Office Action and English translation for Taiwan Application 093124721, Feb. 15, 2011.

(Continued)

*Primary Examiner* — Pegeman Karimi
(74) *Attorney, Agent, or Firm* — Baker Botts LLP

(57) ABSTRACT

A capacitive position sensor for detecting the position of an object relative to a resistive sensing element. The sensing element comprises a sensing path that has terminals connected along it that subdivide the sensing path into multiple sections. Each terminal is coupled to its own sensing channel, each of which generates a signal that is sensitive to the capacitance between its terminal and a system ground. The signals are fed to a processor for analysis. The processor determines over which section the object is positioned by comparing the signals from the sensing channels, and determines the position of the object within that section by comparing the signals from the terminals spanning that section. The sensing path can be formed in a closed loop, such as a circle for a scroll dial, in which the operator's finger position and movement can be uniquely determined in a straightforward manner.

16 Claims, 10 Drawing Sheets

(56) References Cited

U.S. PATENT DOCUMENTS

| | | | |
|---|---|---|---|
| 5,305,017 A | 4/1994 | Gerpheide | |
| 5,461,319 A | 10/1995 | Peters | |
| 5,920,131 A | 7/1999 | Platt et al. | |
| 5,936,613 A * | 8/1999 | Jaeger et al. | 345/172 |
| 5,977,956 A | 11/1999 | Gerrard | |
| 6,282,804 B1 | 9/2001 | Jiang | |
| 6,400,359 B1 * | 6/2002 | Katabami | 345/173 |
| 6,452,514 B1 | 9/2002 | Philipp | |
| 6,466,036 B1 | 10/2002 | Philipp | |
| 6,492,979 B1 * | 12/2002 | Kent et al. | 345/173 |
| D472,245 S | 3/2003 | Andre et al. | |
| 6,670,949 B1 | 12/2003 | Ahn et al. | |
| 7,148,704 B2 | 12/2006 | Philipp | |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2002/0030666 A1 | 3/2002 | Philipp | |
| 2003/0098699 A1 * | 5/2003 | Lemkin et al. | 324/678 |
| 2004/0104826 A1 * | 6/2004 | Philipp | 341/34 |
| 2004/0252109 A1 * | 12/2004 | Trent et al. | 345/174 |
| 2009/0315854 A1 | 12/2009 | Matsuo | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |

FOREIGN PATENT DOCUMENTS

| | | |
|---|---|---|
| TW | 440683 | 6/2001 |
| TW | 284195 | 7/2003 |
| WO | WO 03/088176 | 10/2003 |
| WO | WO 2012/129247 | 9/2012 |

OTHER PUBLICATIONS

International Search Report and Written Opinion of the ISA in corresponding PCT application PCT/GB2004/003460, Dec. 7, 2005.

Hamamatsu; One Dimensional PSD: Catalog No. KPSD1002E02; Feb. 2001; Hamamatsu Photoics K.K.; Hamamatsu City, Japan, Feb. 2001.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

* cited by examiner

Switching Sequence of A, A', A", B, B', B", C, C', C" for figure 3

S1  Reset counters CT1, CT2, CT3
S2  Close A, A', A", C, C', C" (reset Cs1, Cs2, Cs3)
S3  Float all switches
S4  Close B, B', B" (Charge Cs1, Cs2, Cs3)
S5  Float all switches
S6  Close A, A', A" (Clamp strip to ground)
S7  If (VCs1 < Vt) then increment CT1;
    If (VCs2 < Vt) then increment CT2;
    If (VCs3 < Vt) then increment CT3
S8  If ((VCs1 < Vt) or (VCs2 < Vt) or (VCs3 < Vt)) then goto step 3
S9  Float all switches
S10 Goto step 1 to repeat (if desired)

Fig. 6

CLOSED PATH CAPACITIVE POSITION SENSOR

RELATED APPLICATIONS

This application is a continuation of U.S. application Ser. No. 10/916,744 filed Aug. 12, 2004 which claims priority to U.S. Provisional Application No. 60/496,939 filed Aug. 12, 2003.

BACKGROUND OF THE INVENTION

The invention relates to capacitive position sensors, more particularly the invention relates to capacitive position sensors for detecting the position of an object around a curved path.

Capacitive position sensors are applicable to human interfaces as well as material displacement sensing in conjunction with controls and appliances, mechanisms and machinery, and computing.

Capacitive position sensors in general have recently become increasingly common and accepted in human interfaces and for machine control. In the field of home appliances for example, it is now quite common to find capacitive touch controls operable through glass or plastic panels. These sensors are increasingly typified by U.S. Pat. No. 6,452,514 [1] which describes a matrix sensor approach employing charge-transfer principles.

Due to increasing market demand for capacitive touch controls, there is an increased need for lower cost-per-function as well as greater flexibility in usage and configuration. Similarly, there is a significant demand for capacitive material displacement sensors (e.g. fluid level sensors, mechanical movement sensors, pressure sensors etc.) at lower price points, which cannot be easily met with current generations of non-mechanical transducers.

In many applications there is a need for a human interface having many keys or sensing positions, nearly (but not) akin to the flexibility afforded by 2-D touch screens or touch pads as typified by U.S. Pat. No. 4,476,463 [2] and U.S. Pat. No. 5,305,017 [3]. For example, in a computer monitor, it is desirable to have controls on the screen bezel to allow adjustment of brightness and contrast; ideally, as in former times, a continuously adjustable control (e.g. a potentiometer) is used to control these parameters. Due to price pressures and aesthetic requirements, these have been usually eliminated in favor of just a few bezel-mounted menu selection buttons which are much harder to understand and adjust.

In the fields of electronic and medical test instruments, LCD displays are often used in conjunction with rows of bezel buttons to provide software-driven menu functions. Many such applications do not allow the expense, reduced contrast, and fragility of touch screens, yet meanwhile suffer from deep or limited menu options and visual parallax. An example of this type of menu control is to be found in almost any current cash dispenser such as the NCR LCD-5305. Manufacturers would use higher resolution controls on or closer to the edge of the screen if economic considerations could be met. Similar markets exist for domestic appliances, educational games, information/internet kiosks, and the like.

In the field of heating ventilation and air conditioning (HVAC), the state of the art in wall-mount thermostatic controls is currently exemplified by the Honeywell model CT8602, a menu-drive system with a small LCD screen. Advanced features in these devices are accessed via deep levels of menus which are often non-intuitive compared with simple dial or slider based controls.

Electromechanical human interface controls (such as pushbuttons, membrane switches, and potentiometers) have the noted deficits of being unreliable and subject to water ingress, as well as being only marginally compatible with LCD based menu systems. Classic user controls like dials and resistive potentiometers require panel openings which allow dirt and moisture to enter into the product. They also do not present a 'clean' appearance, are considered increasingly quaint, and seriously limit the flexibility of industrial designers. U.S. Pat. No. 5,920,131 [4] describes one solution to this problem, in the form of a rotary knob which is magnetically held to a seamless panel surface and which magnetically interacts with position sensing detectors below the panel surface. However this solution still requires a protruding knob and is expensive to manufacture.

More recently there has been the appearance of 'scroll wheels' as input devices, as typified by the Apple Computer iPod MP3 player, and shown in U.S. Pat. No. D472,245 [5]. These devices have either a mechanical input scroll device or a capacitive device based on circuitry from Synaptics, Inc. (San Jose, Calif., USA).

There exists a substantial demand for new human interface technologies which can, at the right price, overcome the technical deficits of electromechanical controls on the one hand, and the cost of touch screens or other exotica on the other.

In the field of mechanical displacement sensing, Linear Variable Differential Transformers (LVDTs) exemplified by the Schaevitz Sensors (Slough, UK) MP series exist to provide precision positioning information for feedback in process controls. Other smaller devices such as the Schaevitz Sensors XS-B series are incorporated into machines and instruments. Such devices are usually high-cost solutions albeit very accurate, and rely on magnetic field balance measurements made with expensive signal conditioners to operate. These devices exist to provide highly reliable non-contact sensing that can operate in harsh environments with great precision. They solve the wiper-reliability problem of resistive potentiometric methods by eliminating the use of a physical contact. Similarly, there exist capacitive position sensors as exemplified by the RDP Electrosense Inc. (Pottstown, Pa., USA) Rotational Capacitive Displacement Transducer (RCDT), which also requires a special, expensive signal conditioner to operate. An example of such technology is described more fully in U.S. Pat. No. 5,461,319 [6] which describes a bridge based circuit. Capacitive based devices can accommodate both linear and rotational position sensing. For example U.S. Pat. No. 5,079,500 [7] describes a linear or rotary 'potentiometer' having a capacitive wiper, which makes for a highly reliable method of position sensing as it does not use a galvanic wiper. Adaptations are available to measure pressure and by inference, fluid level. The above referenced technologies however suffer the problem of being very complex and expensive to manufacture, limiting their use to high-end or industrial equipment. In addition, U.S. Pat. No. 5,079,500 [7] makes use of an 'active wiper', that is, the wiper terminal is connected to amplifier electronics, making that invention unsuited use for human touch.

LVDT and RCDT type transducers work very well, but leave untapped a very large market for low cost devices which can be used commercially in automotive and appliance applications.

FIG. 1 schematically shows a resistive sensing element 2 for use in a linear capacitive position sensor described in the present inventor's co-pending U.S. patent application Ser. No. 60/422,837 [8], incorporated herein by reference. The resistive sensing element 2 extends between first and second terminals 4, 6. Each terminal 4, 6 is connected to a respective sensing channel 8, 10. Each one of the sensing channels is operable to generate an output signal which depends on the capacitance between the terminal to which it is connected and a ground 14. The resistive sensing element 2 has an inherent capacitance Cd to ground 14. This inherent capacitance Cd is distributed along the length of the resistive sensing element 2, as shown schematically in FIG. 1. When a user's finger 12 is located close to the resistive sensing element 2, the user provides an additional capacitive coupling between the resistive sensing element 2 and ground 14. This additional capacitive coupling is schematically shown by capacitor Cx in FIG. 1. The presence of additional capacitance Cx modifies the capacitance between the each of the terminals 4, 6 and the ground 14. In particular, it is found that the ratio of the changes in capacitance associated with each of the terminals depends on the position of the finger along the resistive sensing element. For example, if the ratio is unity, the finger is midway along the resistive sensing element. Using this type of position sensor, the position of a finger can be determined independent of the magnitude of the capacitive coupling provided by the finger. This means the sensor can be used with different kinds of pointer, e.g. fingers and styli, while providing consistent results. This scheme provides for a simple and effective alternative to more complex LDVT sensors.

In many cases a rotary position sensor, i.e. one which is capable of determining the position of an object along a circular path, is desired. For example, to provide an equivalent to a mechanical rotary knob which can be used in a touch sensitive control panel.

FIG. 2 schematically shows a plan view of a resistive sensing element 16 for use in a rotary capacitive position sensor of the kind proposed in U.S. patent application Ser. No. 60/422,837. The general functions of this device are similar to the device of FIG. 1. Many features of FIG. 2 are similar to and will be understood from correspondingly numbered features of FIG. 1. However, the resistive sensing element 16 of FIG. 2 differs from that of FIG. 1 in that it is arranged in a curved path, namely an arc. The underlying operation of a rotary capacitive position sensor based on the resistive sensing element of FIG. 2 is as described above with respect to FIG. 1. However, because of the arcuate arrangement of the resistive sensing element, the position at which a finger approaches the resistive sensing element can be translated to an angular position about the center of the resistive sensing element. Although the resistive sensing element 16 of FIG. 2 can provide for a simple yet effective rotary capacitive position sensor, it is limited as to the angular range over which it can operate. For example, in FIG. 2 it can be seen that the terminals 4, 6 defining the extent of the sensitive area of the position sensor are separated by around 30 degrees. This provides for a sensor with a sensitive angular-span of around 330 degrees and a dead zone of around 30 degrees. The dead zone between the terminals cannot be made arbitrarily small. This is because a finger placed near one terminal would otherwise provide a direct capacitive coupling to ground for the other terminal due to its proximity thereto. This can lead to ambiguity in calculated position. For example, with a finger placed over one terminal which is located too close to another terminal, the respective sensing channels 8, 12 can measure broadly similar signals. Similar signals is also what is seen when a finger is placed about midway around the resistive sensing element and hence a reported can be ambiguous. It may be possible to remove the ambiguity based on the overall magnitude of the signals detected, but this requires a priori knowledge of the typical magnitude of capacitive coupling to be expected from the finger, or other pointer. This can mean that different magnitudes of capacitive coupling can lead to differently calculated positions.

A similar ambiguity arises whenever a finger can provide a direct capacitive coupling to multiple parts of a resistive sensing element, for example, where the overall scale of the resistive sensing element is small. In such cases it can be possible for a finger placed over one location on the sensing element to provide a direct capacitive coupling to ground for another location, even if the dead zone between the terminals itself is suitably large. This can again leads to ambiguity and so limits how tightly a resistive sensing element 16 of the type shown in FIG. 2 can be curved. This is a problem where space is at a premium, e.g. when designing control interfaces for small portable devices.

SUMMARY OF THE INVENTION

According to one aspect of the invention there is provided a capacitive position sensor for detecting a position of an object comprising:

(a) a sensing element comprising a sensing path;

(b) a plurality of at least three terminals connected to the sensing element at different locations along the sensing path to subdivide it into a plurality of sections;

(c) a plurality of sensing channels connected to respective ones of the terminals, wherein each sensing channel is operable to generate a signal indicative of capacitance between its terminal and a system ground; and (d) a processor operable to determine over which section the object is positioned by comparing the signals from the sensing channels, and to determine the position of the object within that section by comparing at least the signals from the terminals spanning that section.

This arrangement provides for a simple capacitive sensor which does not suffer from the ambiguities which can arise with the above-described capacitive position sensors, for example ambiguities which can arise when an object is capacitively coupled to more than one part of the resistive sensing element at the same time.

The arrangement also allows for a resistive sensing element which may be disposed around a closed path. This allows, for example, the position of an object to be detected around a full 360 degrees. By allowing the position of an object to be tracked in this way, an effective alternative to multi-turn potentiometers can be provided for touch-sensitive control panels. It may also be useful for open-path sensor shapes, such as U-shape, or even linear, since it provides a general way of overcoming non-linearities or other problems that may occur with a simple two-terminal sensor.

The resistive sensing element may be embodied by a single resistor, for example it may comprise a resistive material deposited on a substrate to form a continuous pattern. This provides for an easy-to-fabricate resistive sensing element which can be deposited on the substrate in any one of a range of patterns. Alternatively, the resistive sensing element may be made from a plurality of discrete resistors. The discrete resistors may be alternately connected in series with a plurality of conducting sense plates, the sense plates providing for increased capacitive coupling between the object and the restive sensing element. This provides for a resistive sensing element which can be fabricated from widely available off-the-shelf items.

The resistive sensing element may have a substantially constant resistance per unit length. This provides for a capacitive position sensor having a simple uniform response.

Where greater positional resolution is required and/or when employing a relatively long resistive sensing element, the resistive sensing element may include more than three terminals.

The sensing channels may each include a sampling capacitor connected in series with a corresponding one of the capacitances between the terminals and the system ground such that when connected to a supply voltage each of the sampling capacitors are supplied with an amount of charge which depends on the capacitance between the corresponding ones of the terminals and the system ground. This effectively provides each sensing channel with a capacitive voltage divider comprising the capacitance of the sampling capacitor and the effective capacitance to ground caused by the object's capacitive coupling to the resistive sensing element. This allows the capacitances between each of the terminals and the system ground to be determined from the voltage measured on corresponding ones of the sampling capacitors.

Charge transfer techniques may be used, for example whereby each of the sensing channels comprises a plurality of switching elements and the capacitive position sensor includes a switch controller configured to allow a switching sequence of the switching elements to be performed such that the switching sequence causes each of the sampling capacitors to be connected to and then disconnected from the supply voltage and the terminals to be subsequently connected to the system ground. This provides for a simple way to transfer an amount of charge to each of the sampling capacitors which depends on the capacitances between each of the corresponding terminals and the system ground.

The switching sequence may be executed multiple times, with the terminals being disconnected from the system ground before each sequence execution, such the sampling capacitors are incrementally charged during each sequence execution. This may be done a variable number of times, whereby the number of sequence executions required to charge each of the sampling capacitors to a pre-determined level provides the signals indicative of capacitances between each of the terminals and a system ground, or a fixed number of times, whereby the charge on each of the sampling capacitors after a fixed number of sequence executions provides the signals indicative of capacitances between each of the terminals and a system ground.

The processor may be configured to compare the two largest signals, i.e. the two signals which indicate the largest capacitances to system ground of the terminals. This is an easy way of coarsely determining between which of the terminals the object is positioned before more precisely calculating the object's position between those terminals. Although further precision will generally be desired, it is noted that in some applications it may be sufficient to merely determine between which terminals an object is positioned.

To determine the position of an object between the terminals corresponding to the pair of selected signals, the comparing the selected pair of signals may include forming a ratio of the selected pair of signals, the parameter indicative of the position of an object being derived from said ratio. For example, the parameter may comprise the ratio of one of the selected pair signals to the sum of the selected pair of signals. Prior to performing such a ratio, a signal taken from one of the other terminals may be subtracted from the selected pair of signals.

If there is a significant level of background capacitive coupling between each of the terminals and the system ground (i.e. not due to the presence of the object), the processor may be configured to subtract respective background signals from each of the signals prior to the comparing. The background signals may correspond to the signals obtained when an object whose position is to be detected is distal from the capacitive position sensor. This means that effects due to the position of the object on the capacitances between the terminals and the system ground can be isolated from those found when the object is not present. The background signals may be calculated regularly during use to account for changing conditions.

To determine whether an object is present and to avoid confusion which may occur in attempting to generate a parameter indicative of a position of an object when none is present, the processor may configured to sum the respective signals from the sensing channels and to generate a parameter indicative of a position of an object only if the magnitude of the sum exceeds a detection threshold. The threshold can be set according to how sensitive a designer wishes the capacitive position sensor to be. For example, where there are a number of closely spaced capacitive position sensors on a control panel, the designer may require a high detection threshold to prevent perceived positive detections in one capacitive position sensor when a neighboring capacitive position sensor is being touched. In another case, a lower detection threshold may be preferred to increase the sensitivity of the capacitive position sensor. The processor may be configured to output a status signal indicative of whether the magnitude of the sum of the signals exceeds the detection threshold. This may assist appropriate responses by connected apparatus, e.g. functional equipment being controlled by a control panel.

Once a first parameter indicative of the position of an object has been generated, the capacitive position sensor may then generate a second parameter indicative of the position of the object at a later time and output a signal indicative of motion of the object between the first and second times. This allows the capacitive position sensor to be used to measure the relative of a moving displacement of an object rather than its absolute position.

The object to be detected may be a pointer, for example a finger or a stylus, which can be freely positioned by a user. Alternatively, the object may be a wiper held in proximity to the resistive sensing element, the position of the wiper along the resistive sensing element being detected by the capacitive position sensor. The position of the wiper may be adjusted by a user, for example by turning a rotary knob, or may be coupled to a shaft driven by connected equipment such that the capacitive position sensor can act as an encoder.

In a further embodiment of the invention, the circular element comprises a plurality of discrete resistors electrically connected in series, wherein electrode connections are made in 3 places, and where the junctions of resistor pairs are connected to discrete conductive electrodes to form individual sensing locations. A minimally useful sensor would have 6 resistors along the circle and therefore 6 sensing areas.

In a modification of this second embodiment, the discrete conductive electrodes are of sufficiently small size so as to permit field blending and thus position smoothing on the 'user' or sensing side of the substrate.

It is an object of some embodiments of the invention to provide a one-dimensional positional readout of the location of an object touching a circular element.

It is a further object of some embodiments of the invention to provide a coded output indicative of the computed position of touch plus a signal indicative of the detection of sufficient signal to validate the coded output.

It is a further object of some embodiments of the invention to provide a relative displacement output indicative of motion of a finger along a circular element.

It is yet a further object of some embodiments of the invention to interpret the coded output as one or more discrete touch positions, e.g. buttons.

Another object is to provide for a 'finger scroll wheel' effect through a plastic surface.

It is an additional object of some embodiments of the invention to provide a one-dimensional reading of an amount of angular displacement, due to the angular position of a shaft or object.

Further objects of some embodiments of the invention are to provide for a sensor having high reliability, a sealed surface, low power consumption, simple design, ease of fabrication, and the ability to operate using off-the-shelf logic or microcontrollers.

Some definitions are now made. Unless otherwise noted hereinafter, the terms 'connection(s)' or 'connected' refer to either galvanic contact or capacitive coupling. 'Element' refers to the physical electrical sensing element made of conductive substances. 'Electrode' refers to one of the galvanic connection points made to the element to connect it to suitable driver/sensor electronics. The terms 'object' and 'finger' are used synonymously in reference to either an inanimate object such as a wiper or pointer or stylus, or alternatively a human finger or other appendage, any of whose presence adjacent the element will create a localized capacitive coupling from a region of the element back to a circuit reference via any circuitous path, whether galvanically or non-galvanically. The term 'touch' includes either physical contact between an object and the element, or, proximity in free space between object and element, or physical contact between object and a dielectric (such as glass) existing between object and element, or, proximity in free space including an intervening layer of dielectric existing between object and element. Hereinafter the terms 'circle' or 'circular' refer to any ellipsoid, trapezoid, or other closed loop of arbitrary size and outline shape having an open middle section. The mention of specific circuit parameters, or orientation is not to be taken as limiting to the invention, as a wide range of parameters is possible using no or slight changes to the circuitry or algorithms; specific parameters and orientation are mentioned only for explanatory purposes.

In U.S. Pat. No. 6,466,036 [9] the present inventor teaches a capacitive field sensor employing a single coupling plate to detect change in capacitance to ground. This apparatus comprises a circuit employing repetitive charge-then-transfer or charge-plus-transfer cycles using common integrated CMOS push-pull driver circuitry. This technology forms the basis of some embodiments of the invention and is incorporated by reference herein.

One embodiment of the invention includes a sensing element and control circuit designed to provide a circular surface from which can be read the location of a finger capacitively coupled to the sensing element, wherein the control circuit has three sensing channels for measuring capacitance simultaneously at three electrode points along the circle and a computing device, such as a processor comprising processing logic circuitry, computes the ratio of the relative changes in the amount of capacitance measured at the three points. The result of this computation is a 1-dimensional angular co-ordinate number plus a detection state indicator, both of which can be fed to another function, for example an appliance controller, which interprets the co-ordinate and detection state as a command or measurement.

In one preferred embodiment of the invention, the sensing element is a circular element with three distinct electrodes thereon. Connections are made between each electrode and a circuit comprised of capacitive signal acquisition and signal processing means. The element is normally disposed on an insulating substrate, and is large enough to accommodate the desired targets for detection purposes. The sense field propagates through the substrate; the other side of the substrate forming the active sensing surface for human touch or a mechanical wiper. Direct touch on the element is also possible in which case the substrate only acts as a mechanical carrier. While it is supposed that an element could be solid enough that no substrate is required, normally the element will be a thin layer requiring mechanical support.

BRIEF DESCRIPTION OF THE DRAWINGS

For a better understanding of the invention and to show how the same may be carried into effect reference is now made by way of example to the accompanying drawings in which:

FIG. 6 schematically shows a switching sequence for switching elements in the control circuit of FIG. 5;

DETAILED DESCRIPTION

Figure 3:
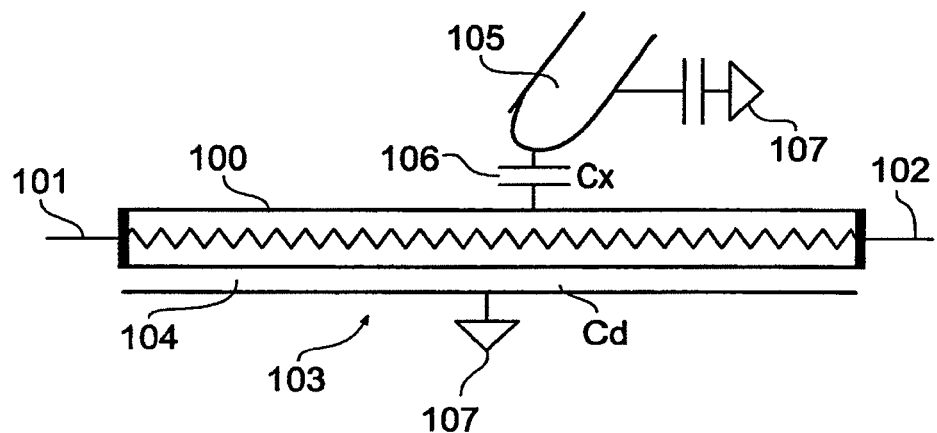
FIG. 3 schematically shows a section view of part of a resistive sensing element employed in an embodiment of the invention.

FIG. 3 shows the construction of a resistive sensing strip 100, also referred to as a sensing element, which is possibly bonded to a control surface composed of a sheet resistor of a specified resistivity, galvanic end terminations 101 and 102, distributed capacitance Cd 104, and spot capacitance 106 due to object 105 proximity. Resistive sensing element 100 can be made of any resistive material including carbon film, metal films, ITO or SnO, conductive plastics, screen deposited conductors, sputtered conductors etc. without limitation as to material or method of deposition so long as the result is a resistive strip, rod, line, arc, or other suitable shape in 1, 2, or 3 dimensions. A resistive sensing element formed this way effectively comprises a continuous single resistor. Stray capacitance Cd does not need to be linearly distributed, because a preferred strip functions equally well with 'lumpy' capacitances by virtue of the principle of superposition.

Figure 4A:
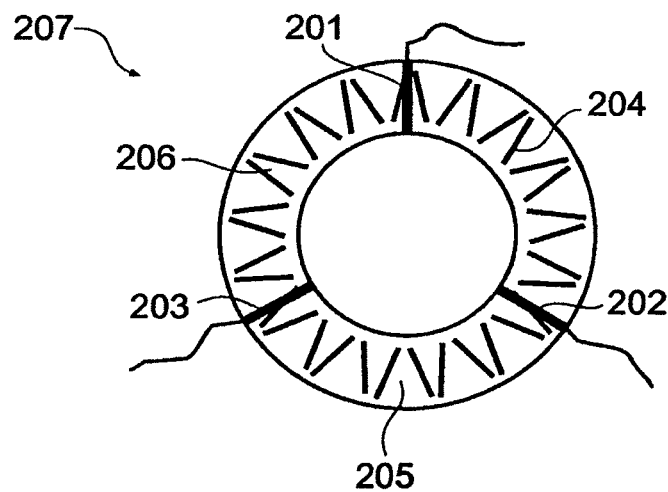
FIG. 4A schematically shows a plan view of a resistive sensing element for use in a rotary capacitive position sensor according to an embodiment of the invention.
Figure 4B:
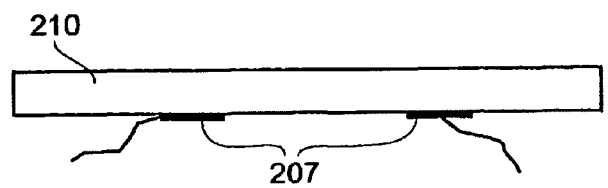
FIG. 4B schematically shows a section view of the resistive sensing element of FIG. 4A bonded to one side of a dielectric surface.

FIGS. 4A and 4B show a resistive sensing element 207 according to an embodiment of the invention as a circle, remembering that a circle for the purpose of this description can be any closed shape. The resistive material comprising the resistive sensing element extends between and is connected to electrodes, also known as terminals, 201, 202, and 203, comprising surfaces 204, 205, and 206. Cross section view FIG. 4B shows this element 207 bonded to a substrate 210; either side of the substrate 210 can be made touch sensitive to the fields generated by the element when properly controlled and sensed. However, in human-interface use, normally the upper (when oriented as shown in FIG. 4B) surface shown will be employed.

Figure 5:
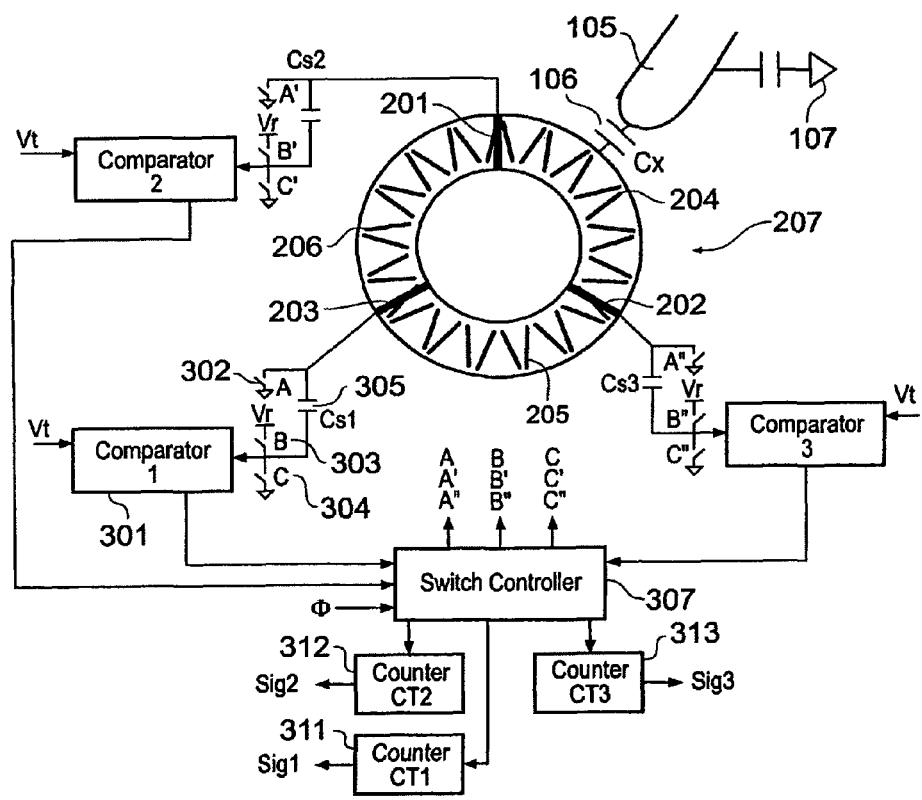
FIG. 5 schematically shows a control circuit diagram for use with the resistive sensing element of FIGS. 4A and 4B.

FIG. 5 shows a preferred control circuit diagram according to an embodiment of the invention for use with a resistive sensing element 207 of the kind shown in FIGS. 4A and 4B. As can be seen from FIG. 5, the control circuit comprises three sensing channels with one being coupled to each of the electrodes 201, 202, 203. The circuitry comprising each individual sensing channel is essentially the same as disclosed in the inventor's co-pending U.S. application 60/422,837, and operates in the same basic manner. However, in this example where there are three electrodes arrayed about the element (in other examples there may be more) there are three sensing channels rather than the two employed in U.S. application 60/422,837. Further detail as to the operation of this sensing circuit can be read in the aforesaid application and is considered further below. This configuration allows the location of touch (i.e. in this example the location of a user's finger 105, which, as can be seen from the figure, creates a capacitive coupling Cx between the resistive sensing element 207 and a system ground 107) to be determined by analyzing the location of spot capacitance Cx along one of the three sectors 204, 205, or 206. More electrodes can be used along with more sensing channels, in order to provide higher resolution or to cover a larger circle than currently envisioned; the principle remains the same.

It will be appreciated that any reference potential may be used as system ground. Depending on the power supply used, the system ground may be at Earth potential. However, any other reference potential could equally be used, for example a reference potential defined internal to the device.

The control circuit of FIG. 5 operates using charge transfer techniques. Charge transfer is governed by controlled switching of a number of switching elements in a sequence under the control of a switch controller 307. This is done at a rate governed by a clock input line to the switch controller labeled Φ in FIG. 5. The number of switching sequences executed throughout a measurement cycle is recorded for each sensing channel in one of three counters 311, 312, 313, respectively labeled CT1, CT2 and CT3 in FIG. 5. As will be seen further below, it is these numbers of counts which are used as output signals Sig1, Sig2 and Sig3 which form the basis of further processing by a processor comprising processing logic circuitry (not shown) to determine the location of a touch along the resistive sensing element 207. As can be seen from FIG. 5, each of the three sensing channels of the control circuit are similar. For simplicity only the sensing channel associated with electrode 203 is considered here. The sensing channel is powered from a single rail DC power supply which operates between a system ground and a supply voltage +Vr. The sensing channel includes first 302, second 303 and third 304 switching elements, respectively labeled A, B and C, a sampling capacitor 305, labeled Cs1, and a voltage comparator 301, labeled "Comparator 1". The voltage comparator 301 is configured to provide an output to the switch controller 307 dependent on the result of comparing a voltage VCs1 present on the sampling capacitor 305 with respect to the system ground with a reference threshold voltage Vt.

The switching elements A, B and C are driven by control signal lines from the switch controller 307. (The three sensing channels are made to operate in time-synchronous fashion so that the three sets of switches A, B, C; A', B', C'; and A", B", C" operate in a substantially simultaneous manner, as indicated by their sharing common control lines from the switch controller shown in FIG. 5.) An appropriate sequence of switching is shown in FIG. 6. The sequence comprises ten steps. As can be seen from FIG. 6, the switching sequence is generally the same for each sensing channel.

In a first step S1, the counters CT1, CT2, CT3 associated with each of the sensing channels are reset. In a second step S2, switching elements A, A', A", C, C' and C" are closed (switching elements B, B' and B" are open). In step S2 both sides of each of the sampling capacitors Cs1, Cs2, Cs3 are connected to system ground to remove any residual charge they may hold. In step S3, all of the switching elements are open. In step S4 switches B, B' and B" are closed. The purpose of floating all switches in step S3 between step S2 and S4 is provide a dead time between switches A, A' and A" being closed in step S2 and switches B, B' and B" being closed in step S3. This avoids accidental shorting of +Vr to system ground which might otherwise occur during any overlap period were step S4 to immediately follow from step S2. In step S4, the sampling capacitors Cs1, Cs2, Cs3 are charged by virtue of their being respectively connected to +Vr through switches B, B' and B" and their being capacitively coupled to ground through capacitance Cx provided by the user's finger 105 (or other pointer in other applications). Kirchoff's current law and the principle of electric charge conservation dictate that the sum of the electric charge on the sampling capacitors Cs1, Cs2 and Cs3 which occurs due to the presence of Cx is equal to the electric charge on Cx. It is found that this electric charge is shared between the three sampling capacitors depending on the resistance between each of the electrodes 201, 202, 203 to which the respective sensing channels are coupled and the location of the user's finger over the resistive sensing element 207. The capacitance Cx is effectively split into three "virtual" capacitances Cx1, Cx2, Cx3 (where Cx=Cx1+Cx2+Cx3) which are measured by the measurement sensing channels, the ratio of the split is determined by the location of the capacitive coupling to system ground.

In step S5 all of the switching elements are open. In step S6, switching elements A, A' and A" are closed. This clears the charge on Cx by shorting the resistive sensing element 207 to system ground 107 at each of the electrodes 201, 202, 203. In step S7, the voltage on each of the sampling capacitors Cs1, Cs2, Cs3 is compared with the reference threshold voltage Vt by the respective comparators. For each sensing channel for which the sampling capacitor voltage is found to be less that the reference threshold voltage Vt, the corresponding one of the counters CT1, CT2, CT3 is incremented. This function may be performed by logic in the switch controller. In step S8, logic in the switch controller 207 determines if any of the voltages on the sampling capacitors Cs1, Cs2, Cs3 are less than the reference threshold voltage Vt, and if so, the switching sequence returns to step S3. In this way, steps S3 to S8 are repeatedly looped until the voltage on all of the sampling capacitors exceeds Vt. During each loop through steps S3 to S8 an amount of charge is added to each sampling capacitor as described above. However, once the voltage on any given sampling capacitor exceeds Vt, the counter associated with the corresponding sensing channel ceases to be incremented at step S7 during subsequent loops. Once it is determined at step S8 that the voltage on all sampling capacitors exceeds Vt, the switching sequence moves to step S9 where all switches are opened. This represents the end of one measurement. At this point the counters CT1, CT2, CT3 associated with the three sensing channels store numbers Sig1, Sig2, Sig3 which are indicative of how many charge transfer cycles (i.e. loops through steps S3 to S8) were required to charge the respective sampling capacitors such that their voltage exceeds Vt. This is an inverse measure of how much electric charge each sampling capacitor received during each charge transfer cycle—i.e. a measure of what "fraction" of Cx is effectively connected to the corresponding electrode with which each sampling capacitor is associated. The signals Sig1, Sig2 and Sig3 may then be processed by a processor (not shown) to estimate the position of a touch as described below. In Step S10 the switching sequence returns to step S1 to make a further position estimate (if desired).

In the above described sequence of switching, the durations required for the switch closures and openings are usually measured in nanoseconds or microseconds, although the steps involving resetting the sampling capacitors may be in the millisecond range. The actual or optimal timings depend on the choice of specific component values, which include, the sampling capacitor value, switching element resistance, and the sensing strip resistance. For example, a resistive sensing element having a low resistance, such as 10 kOhm between terminals, for example, may need to employ switch closure durations of 100 ns or less to prevent significant cross-bleed of charge between the sampling capacitors through the resistive sensing element itself.

It will be appreciated that other charge transfer sequences could also be used. For example, it is not necessary to use the comparator and counter scheme described above. In other schemes, a similar switching sequence to that described above could be executed a fixed number of times (rather than a variable number of times based on whether a reference threshold voltage is exceeded). After the fixed number of times, the voltage on each sampling capacitor can be measured using an analogue to digital converter and said voltages used to determine the position of a touch in a manner analogous to that described further below for Sig1, Sig2 and Sig3 (remembering however that said voltages would be directly related to how much charge is transferred during each transfer cycle and not inversely related as Sig1, Sig2 and Sig3 described above are). The scheme shown in FIG. 5, however, relies on relatively easy to implement comparators and counters rather than more complex analogue to digital converters.

Although described above as separate circuitry elements, the functionality of the switch controller, the comparators and switching elements may all be provided by a single general purpose programmable microprocessor, microcontroller or other integrated chip, for example a field programmable gate array (FPGA) or application specific integrated chip (ASIC). In addition, the processor (not shown) which is operable to receive the signals Sig1, Sig2, Sig3 from the counters CT1, CT2, CT3 and to perform the processing described below may also be included in the same single package.

Processing may be performed by appropriately configured processing logic circuitry as follows. The functionality of the processor may be provided by a general purpose programmable microprocessor, microcontroller or other integrated chip, for example a field programmable gate array (FPGA) or application specific integrated chip (ASIC). In this example, a first processing step is the subtraction of any background signals (e.g. obtained from calibration readings) which may be present. In other cases, for example where background signals are expected to be small, this may not be considered necessary.

During an initial phase of operation, at power up for example, calibration readings can be taken of the baseline or 'background' signals from the three sensing channels to obtain 'reference' readings, with no object presumed to be present near the sensor area. These readings correspond to charging of the sampling capacitors Cs1, Cs2, Cs3 which occurs by virtue of the resistive sensing strip having an inherent capacitance to system ground as well as other stray capacitive couplings which may be present. These readings may be taken using the same above switching sequence. Once a calibration is taken, only differential readings, so called "delta-signals", from each channel are processed in order to calculate position. Further, slow changes in the background level of signals can be compensated for by using 'drift compensation' methods that slowly adjust the 'reference' levels in a slew-rate limited manner during intervals of non-detection. Accordingly, the first stage of processing is to obtain the difference between each of Sig1, Sig2 and Sig3 the corresponding background signals Ref1, Ref2 and Ref3. This provides three delta signals ΔSig1, ΔSig2 and ΔSig3 which relate to the effect of the finger, or other object, whose position is to be determined, and exclude the background capacitive couplings which might otherwise induce skewed results. It is noted that with the scheme shown in FIG. 5, the delta signals ΔSig1, ΔSig2 and ΔSig3 are likely to be negative if one subtracts the reference signals from "real time" signals (i.e. signals obtained during real time operation). This is because the counters count fewer times with increasing amounts of capacitance on the resistive sensing element. Since, as will be seen below, the location of a touch can be determined using appropriately-formed ratios of pairs of delta signals, the sign of the delta signals does not affect the estimated position. However, if only positive values for the delta signals are preferred, for example to allow the use of a simplified processor not having the capability of dealing with negative numbers, the delta signals can be generated by subtracting Sig1, Sig2 and Sig3 respectively from Ref1, Ref2 and Ref3 if desired.

To compute the position of an object using the circuit of FIG. 5 the sensor readings from two neighboring electrodes are processed according to the following steps, assuming that the real time acquired signals for the neighboring pair are SigA and SigB (i.e. SigA and SigB are ones of Sig1, Sig2 or Sig3 according to which pair is being processed), and the baseline reference levels are RefA and RefB (where RefA and RefB are corresponding ones of Ref1, Ref2 or Ref3):

1) Compute the delta signals ΔSigA, ΔSigB (as described above)

$$\Delta SigA = RefA - SigA$$

$$\Delta SigB = RefB - SigB$$

2) Compute the ratio Ps indicative of position:

$$Ps = \Delta SigB / (\Delta SigA + \Delta SigB)$$

A positive detection is assumed to have occurred when the total incremental delta signal strength for (ΔSig1+ΔSig2+ΔSig3) rises above a minimum detection threshold value Tx (i.e. when there is enough total difference between the real time signals Sig1, Sig2, Sig3 and the reference signals Ref1, Ref2, Ref3). The processor may be configured to output a signal, for example a status signal, indicative of whether or not this condition is presently satisfied. Tx, i.e. the total incremental delta signal required to indicate a positive detection, will be set depending on how sensitive the designer wishes the position sensor to be. For example, if there are a number of closely spaced position sensors on a control panel, it may be preferable to employ a relatively high value of Tx to avoid one position sensor responding to a finger being placed over a neighboring position sensor.

As described above, the three electrodes 201, 202, 203 divide the resistive sensing element 207 into three sectors 204, 205, 206 bounded by different neighboring pairs of the electrodes 201, 202, 203. Once a positive detection is identified, the location of the touch is assumed to occur within the sector bounded by the two electrodes coupled to the sensing channels showing the two greatest delta signals. These two delta signals are then used as the delta signals ΔSigA and ΔSigB referred to above.

Once the appropriate neighboring pair of the electrodes 201, 202, 203 has been selected and processed as described above, the value Ps defines the calculated position within one sector, referenced from one of the two sector electrodes and is in the range 0 to 1. Only the sector with the largest total touch signal need be processed in this manner to arrive at a position location. The remaining electrode signal can be ignored. If a finger is directly on an electrode so that two sectors are receiving equal amounts of signal, the logic can simply decide to pick one sector over the other, or make an exceptional decision. For example, the fact that one sensing channel measures a large delta signal and the other sensing channels measure equal smaller sensing channels indicates that a touch is made directly over the electrode measuring the large delta signal.

Should a touch be made close to but not directly above one terminal, the sensing channels associated with the other two terminals will observe similar but slightly different signals. Where the difference in these signals is small compared to their measurement accuracy it is possible that the processor might determine the touch to occur in the wrong sector. An advantage of capacitive sensors according to the invention is that should this occur the calculated position will nonetheless remain in the vicinity of the terminal being touched and the error does not lead to gross inaccuracy in estimated position.

Although not corresponding to a full analytical solution, Ps is found to be an excellent approximation to position. Ps is also found to be remarkably free of effects from differently sized objects (e.g. differently sized fingers used to indicate a position) and, with uniform resistivity around the resistive sensing element 207, an excellent linearity of response is observed.

Figure 7:
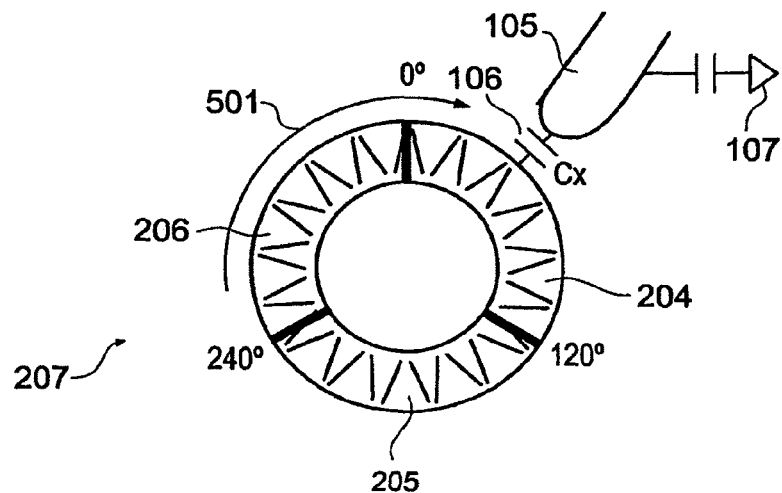
FIG. 7 schematically shows an angular-position co-ordinate system defined for the resistive sensing element of FIGS. 4A and 4B.

FIG. 7 is a schematic plan view of the resistive sensing element 207 of FIG. 5. FIG. 7 shows how an angular position may be defined around the resistive sensing element. In this example, the electrode at the boundary between resistive element sectors 206 and 204 is arbitrarily defined to correspond to an angular position of 0 degrees. Since in this example the three electrodes are equi-angularly spaced (this need not always be the case), the remaining two electrodes are at corresponding angular positions of 120 degrees and 240 degrees. Accordingly, if the outputs from the sensing channels indicate that a touch has occurred in sector 204 (i.e. the delta signals for the sensing channels coupled to the electrodes at the ends of this sector are the two largest) and the processing above provides a value of Ps of 0.4, an angular position for the touch of 0.4*120=48 degrees is determined. It will be appreciated that the determined position will be as measured from the electrode corresponding to the sensing channel providing delta signal ΔSigA. If the same value of Ps was determined but where the largest delta signals were found to corresponded to the sensing channels coupled to the electrodes bounding resistive sensing element sector 205, a position of 120+0.4*120=168 degrees would be determined. If a value of Ps of 0.63 was determined with the largest delta signals corresponding to the electrodes bounding resistive sensing element sector 206, a position of 240+0.63*120=316 degrees would be determined. These example are for a resistive sensing element 207 having constant resistivity (i.e. constant resistance per unit length). This need not be the case, in other examples, a non-uniform resistivity may be preferred, for example to provide a different angular resolution at different angular positions. In such cases a transform based on the variation of resistivity along the resistive sensing element can be used to transform Ps into an angular position.

Figure 8:
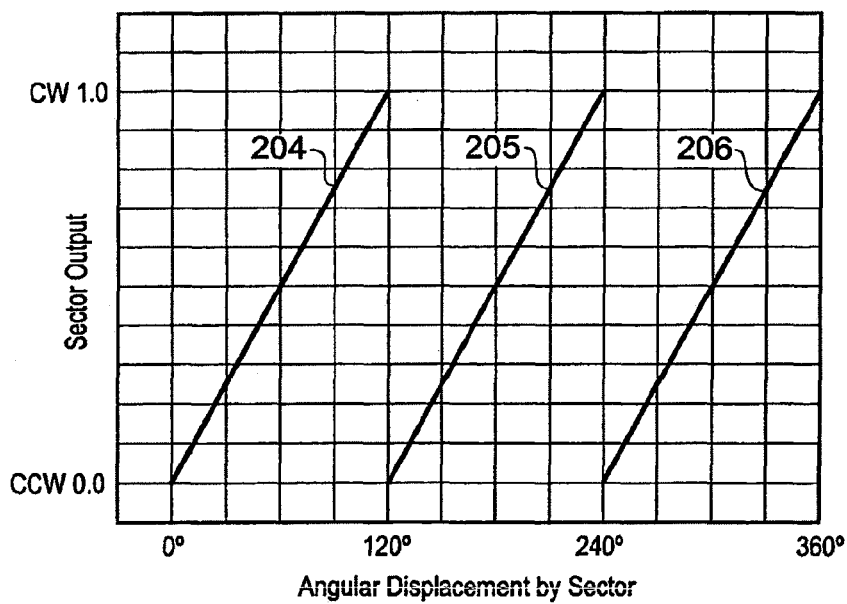
FIG. 8 schematically shows example conversion results for a touch proximate the resistive sensing element of FIGS. 4A and 4B as a function of position of the touch in the co-ordinate system shown in FIG. 7.

FIG. 8 shows the sector result of the signals processed according to the inventor's co-pending U.S. application 60/422,837 and as described above when applied to the results between any two adjacent electrodes along the element. Three outputs can be provided, one for each sector. As a finger is rotated around the element, the processor logic circuitry processes the received capacitance signals from the electrodes to arrive at a determination of which sector the finger is dominantly located in. Within that sector, the processor performs a ratiometric analysis of the bracketing electrode signals to provide a location of touch along that sector. Signals emanating from other sectors not being touched or only being touched to a lesser degree will be of lower strength, and the processor can therefore act to ignore the weaker signals. Ambiguities will arise when a finger is located directly on an electrode, however such an ambiguity is relatively simple to resolve by logic which the practitioner can readily arrive at.

In some embodiments, position estimates may be obtained by combining signals from all three sensing channels (or from more sensing channels where more than three are provided). In the above definition of Ps, the delta signals ΔSigA and ΔSigB corresponding to the two largest of ΔSig1, ΔSig2 and ΔSig3 define in which sector a touch occurs. signals ΔSigA and ΔSigB are then used to calculate the position of the touch within that sector as described above. In an alternative example, the position of an object is computed whereby the sensor readings from all three electrodes are processed as follows.

1) Compute the delta signals ΔSigA, ΔSigB, ΔSigC (as described above)

$$\Delta SigA = RefA - SigA$$

$$\Delta SigB = RefB - SigB$$

$$\Delta SigC = RefC - SigC$$

2) Compute Qs, which is indicative of position:

$$Qs = (\Delta SigA - \Delta SigC)/((\Delta SigA - \Delta SigC) + (\Delta SigB - \Delta SigC))$$

Where ΔSigA and ΔSigB are the two largest delta-signals and ΔSigC is the smallest delta-signal. As before, the touch is assumed to occur in the sector bounded by the terminals associated with the two largest delta-signals ΔSigA and ΔSigB. However, the position within this sector is determined by taking into account the smallest delta-signal ΔSigC as well as the two largest. As with the parameter Ps described above, the value Qs defines the calculated position within that sector, referenced from the appropriate one of the two sector electrodes and is in the range 0 to 1.

For the detection of objects having a variable coupling to the strip, the signal processing performed to generate Ps, Qs or any other parameter indicative of position is made only when the total magnitude of the change in all signal strengths with respect to a reference value rises above a minimum threshold value. This object detection process should preferably incorporate hysteresis and filtering to improve onset detection characteristics.

Further processing of the result can include—
  segmenting a result to fall into a specific location 'bin' for the purpose of defining key regions
  signal filtering of Ps to reduce position noise
  'lift off' detection, whereby the removal of the object and subsequent loss of signal is detected and processed so as to permit the memory of the last contacted position with accuracy Although in the above example a uniformly resistive sensing element is described, it will be appreciated that other types of resistive sensing element may be used.

Figure 9A:
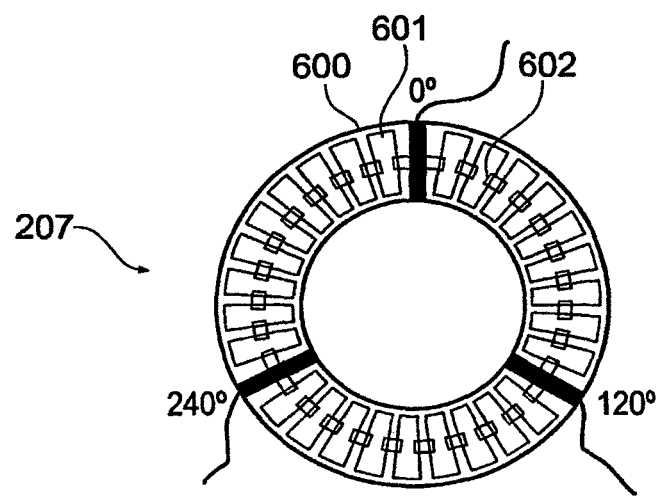
FIG. 9A schematically shows a plan view of a resistive sensing element for use in a rotary capacitive position sensor according to another embodiment of the invention.
Figure 9B:
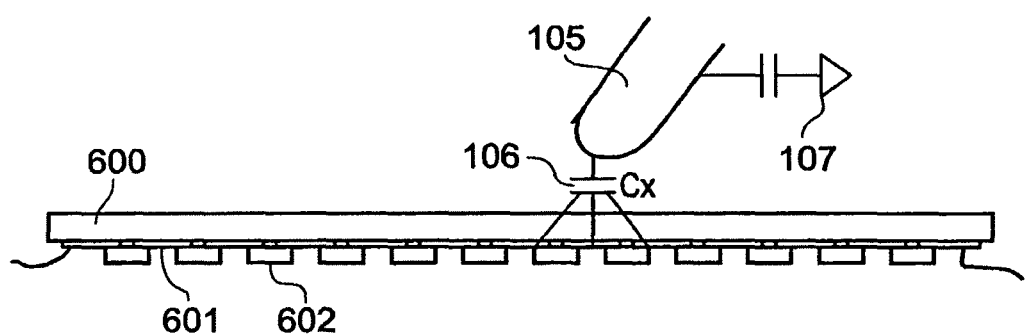
FIG. 9B schematically shows a section view of the resistive sensing element of FIG. 4A bonded to one side of a substrate.

Construction of a resistive sensing element 600 as a lumped model is shown in FIGS. 9a and 9b with discrete resistors 602 and conductive discrete pads 601, also known as sense plates. This is operationally identical to the configuration of FIGS. 4A and 4B, except that the displacement representation of a lumped version is in theory more granular for obvious reasons. Through a substrate, this granularity largely disappears due to field mixing between adjacent pads as shown in FIG. 9b and as explained in the inventor's co-pending U.S. patent application 60/422,837.

Figure 10:
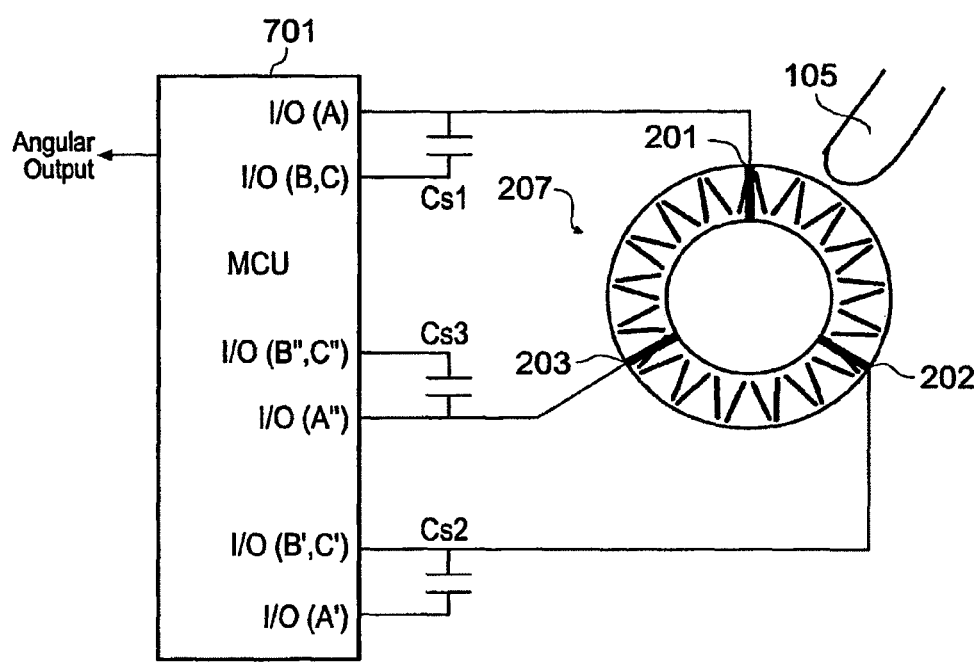
FIG. 10 schematically shown an implementation of the control circuit of FIG. 5 as a micro-controller.

FIG. 10 shows an embodiment of the invention, wherein the resistive sensing element is driven by simple switching logic from a single logic device 701. The switching logic provided by switching elements operating according to the switching sequence shown in FIG. 6 plus all signal processing aspects are subsumed within the logic device 701 to provide a very low cost position detector. The logic device 701 can be a single-chip microcontroller, for example. The I/O ports of the microcontroller may be manipulated in the correct sequence as shown in FIG. 6. An I/O port pin of a microcontroller typically has at least the 3 switches necessary to implement the switching sequence of the example shown in FIG. 6 under software control. The software can readily implement all the switches, control logic, and counters shown in FIG. 5 and sequencing of FIG. 6. The microcontroller may preferably have a push-pull type CMOS pin structure, and an input which can be made to act as a voltage comparator. Most common microcontroller I/O ports are capable of this, as they have a relatively fixed input threshold voltage as well as nearly ideal MOSFET switches. The output of this controller can be either a pulse width modulated (PWM) signal which can be filtered to analog form, or a serial output such as the well known UART, SPI, or I2C formats (or any other type). Such a microcontroller may also be go on to process a useful function as well, for example to control a triac for lighting dimming or motor control in response to a detected angular position, in which case the microcontroller output will be highly processed and application specific.

Figure 11A:
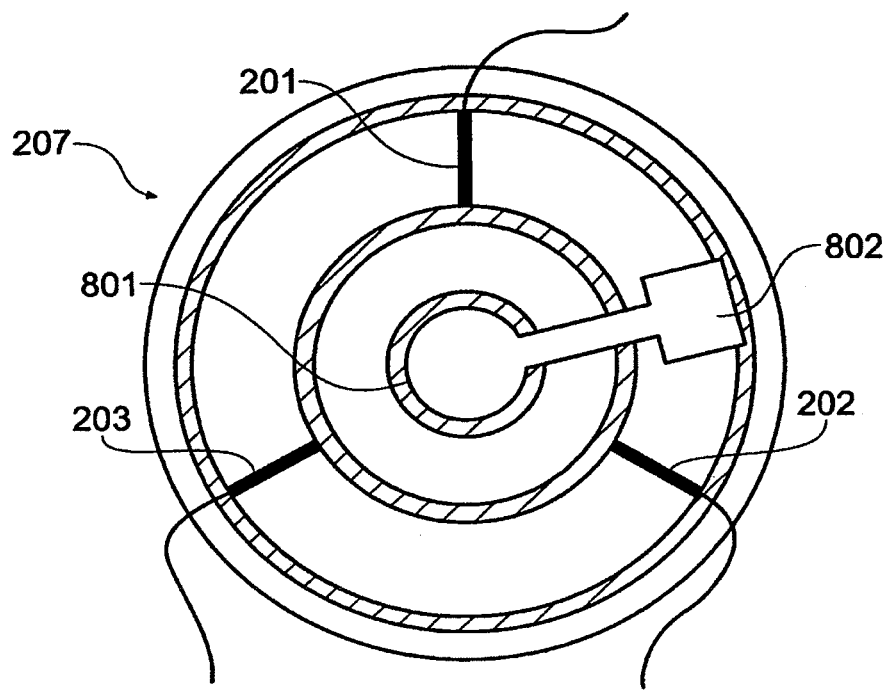
FIGS. 11A and 11B schematically show respective plan and section views of a rotary position encoder employing a capacitive position sensor according to an embodiment of the invention.
Figure 11B:
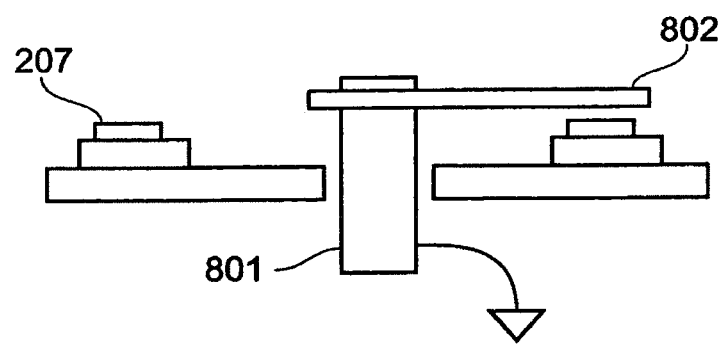

FIGS. 11A and 11B schematically show respective plan and section views of a rotary encoder according to the invention. A wiper 802 is connected to an AC signal reference via shaft 801. Resistive sensing element 207 is therefore affected by the angular displacement of shaft 801, by virtue of the movable capacitance induced by the wiper 802. This is an example where the position of an object other than a finger is being detected. Such a rotary encoder can be made to operate with a human control, a machine shaft encoder, or the like.

Figure 12:
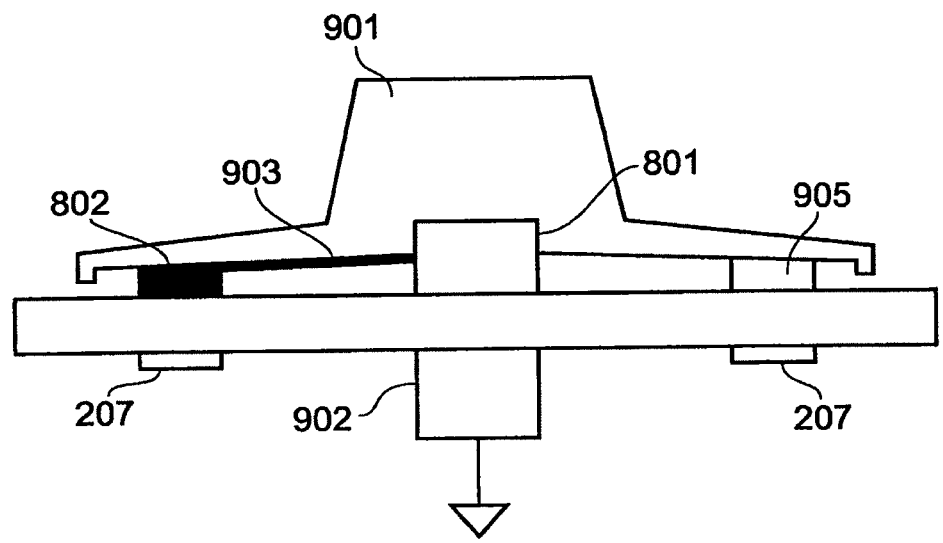
FIG. 12 schematically shows a section view of a rotary control knob employing a capacitive position sensor according to an embodiment of the invention.

FIG. 12 schematically shows a section view of a human operable control knob 901 using a resistive sensing element 207 according an embodiment the invention. Knob 901 is made of either conductive or insulating material. A magnet 801 is bonded to the inside of the knob 901, and holds the knob 901 against a panel by attraction to a ferromagnetic 'shaft' 902. A conductive wiper 802 provides a moving vane which provides a capacitive coupling to element 207, the location of which can be measured as described above. A spacer 905 holds the knob 901 upright and provides balance (the spacer may be integrally formed with the knob). Capacitive coupling through the panel may be used to effect a return signal path, or, the knob itself may provide this path via the body capacitance of a user (not shown). A conductive path 903 provides a return path to magnet 801 if a human body is not relied upon. It will be appreciated that in other example, the knob may be mounted on a post extending from the panel, or may itself have a post arranged to fit into a recess or opening in the panel, rather than being magnetically mounted.

Figure 1:
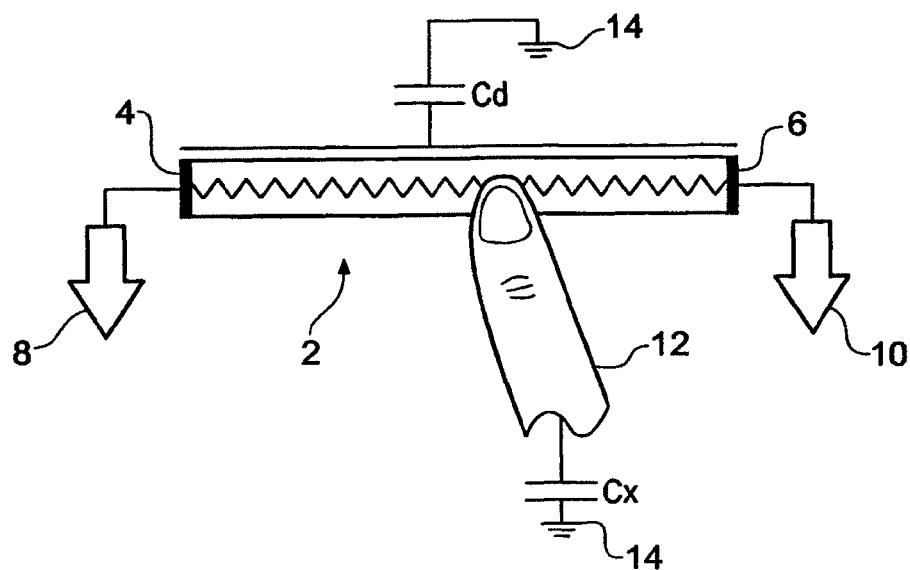
FIG. 1 schematically shows a plan view of a resistive sensing element for use in a linear capacitive position sensor of the kind proposed in U.S. patent application Ser. No. 60/422,837.
Figure 2:
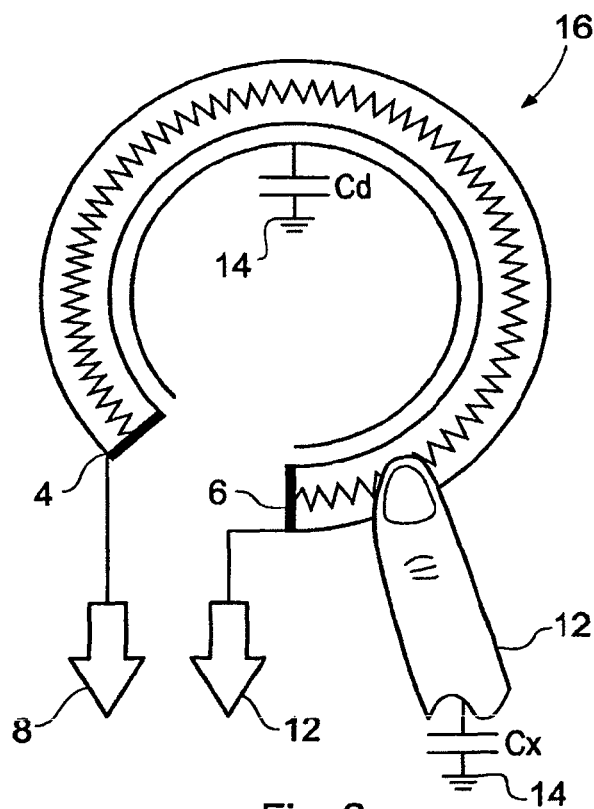
FIG. 2 schematically shows a plan view of a resistive sensing element for use in a rotary capacitive position sensor of the kind proposed in U.S. patent application Ser. No. 60/422,837.

In the above examples, the absolute angular position of an object, e.g. a finger or wiper element, is determined. However, it will be appreciated that, for example in a fingertip scroll wheel application, the angular position output can be simply processed further to translate the angular position into one of 'change in angular position', thus providing an output indicative of the direction of scroll and the amount of scrolling distance and speed of scroll etc. Usually in these applications absolute position is not required, and as a result absolute accuracy can be quite poor yet the control will remain acceptable. A resistive sensing element of the kind shown in FIG. 5 is well suited to this kind of application since a user may scroll continually and smoothly around a full circle and beyond. This would not be possible, for example, using the scheme shown in FIG. 2.

Figures 13, 14A, 14B, 14C:
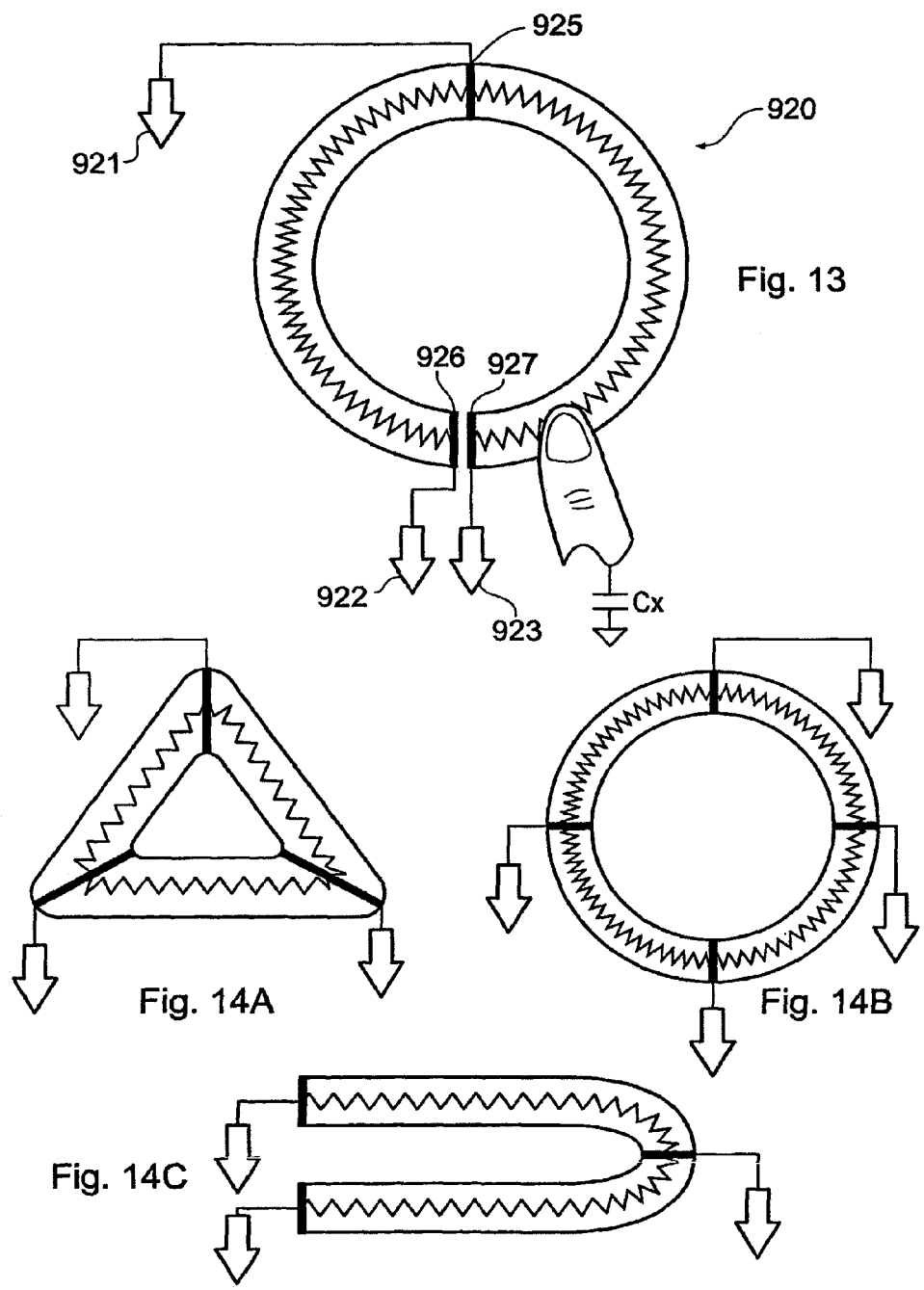
FIG. 13 schematically shows a plan view of a resistive sensing element for use in a capacitive position sensor according to another embodiment of the invention.
FIG. 14A-C schematically show plan views of resistive sensing elements for use in capacitive position sensors according to other embodiment of the invention.

FIG. 13 schematically shows a plan view of a resistive sensing element 920 according an embodiment of the invention in which a resistive sensing element 920 forms an open path, i.e. does not form a closed path as in the previous embodiment. Three sensing channels 921, 922, 923 are respectively coupled to three electrodes 925, 926, 927 connected to the resistive sensing element 901 as shown in the Figure. The resistive sensing element 901 is similar to that of FIG. 5 except that the electrodes 925, 926, 927 are not equi-angularly spaced and the resistive sensing element 901 does not extend between one of the pairs of electrodes, namely between electrodes 926 and 927. This means the resistive sensing element 901 has a dead zone between these electrodes. However, the restive sensing element of FIG. 13 may be operated as described above to detect the position of a touch between either of the other pairs of electrodes. This scheme can help remove any ambiguity which may occur in a capacitive position sensor caused by an object providing a direct capacitive coupling between a system ground and multiple different parts of a resistive sensing element, but where a "full-circle" sensing element is not required.

FIGS. 14A-C schematically show plan views of other configurations of resistive sensing element which may be used in capacitive position sensors according to other embodiments of the invention. Many others configurations are possible. The particular configuration of a resistive sensing element employed in any given application can be selected according to how a designer wishes a corresponding control interface to appear and/or operate.

In FIG. 14A, the resistive sensing element is configured to form a closed triangular shape. In FIG. 14B, a circular resistive sensing element is used, but includes four electrodes with four corresponding sensing channels. This may be used, for example, to provide better positional resolution in a large diameter sensor. In FIG. 14C a resistive sensing element having the same topology as that of FIG. 13 is shown but which is differently configured.

Figure 15:
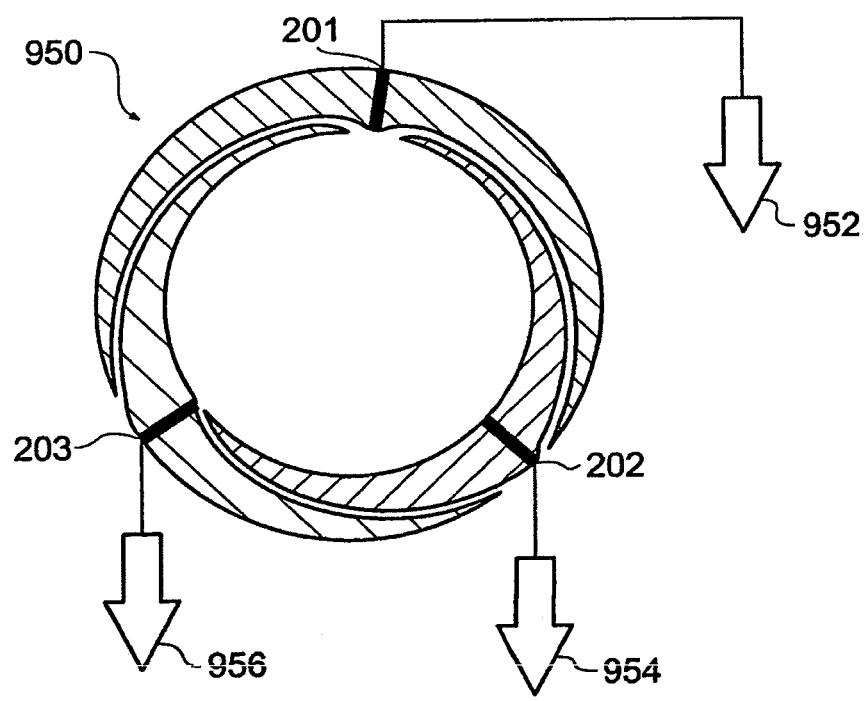
FIG. 15 schematically shows a plan view of an alternative sensing element for use in capacitive position sensors according to other embodiment of the invention.

FIG. 15 shows an alternative sensing element 950 having three terminals 201, 202, 203 which are coupled to sensing channels 952, 954, 956 of the kind described above. The sensing element 950 is based on three pairs of tapering triangular electrodes extending adjacent to each other and curving around between respective pairs of the terminals as shown in the figure. The sensing element is thus formed of conductive material, instead of the resistive body used in the above described embodiments. Other geometric forms of the taper can be used. Further details of these kinds of arrangement are given in my earlier U.S. Pat. No. 6,288,707 (see for example FIGS. 4, 5 & 6 and supporting text).

Although the above examples have employed charge transfer techniques, it will be appreciated that other kinds of sensing channels or different charge transfer techniques may be also used. For example, the method of switching described herein can be adapted to any of the switching sequences and topologies as described in my U.S. Pat. No. 6,466,036 and these are incorporated herein by reference. However the preferred method is that disclosed in FIGS. 5 and 6 herein. This particular configuration and switching sequence is robust against external noise and leakage currents, as the signal sampling is done while the strip itself is connected to ground or other form of low-Z reference.

There are many variations possible as will become evident to those skilled in the art, involving various combinations of detection methods or switch sequences outlined specifically herein. The method can be combined with methods taught in any number of the inventor's prior patents including methods for drift compensation, calibration, moisture suppression using short switch closure times, noise immunity via variable timing pulse modulation (spread spectrum), and the like.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

REFERENCES

[1] U.S. Pat. No. 6,452,514
[2] U.S. Pat. No. 4,476,463
[3] U.S. Pat. No. 5,305,017
[4] U.S. Pat. No. 5,920,131
[5] U.S. Pat. No. D472,245
[6] U.S. Pat. No. 5,461,319
[7] U.S. Pat. No. 5,079,500
[8] U.S. Ser. No. 60/422,837
[9] U.S. Pat. No. 6,466,036

ADDITIONAL PRIOR ART

[10] Hamamatsu one-dimensional PSD product name S1352
[11] U.S. Pat. No. 4,761,546

What is claimed is:

1. A capacitive position sensor for detecting a position of an object comprising:
    a single resistive sensing element comprising one continuous resistor that forms a closed sensing path;
    a plurality of at least three terminals disposed along the single resistive sensing element at different locations along the closed sensing path, each of the plurality of terminals coupled to a respective one of a plurality of sensing channels;
    a plurality of at least three sensing channels that are each connected to a respective one of the plurality of terminals, wherein each sensing channel is operable to generate a signal indicative of capacitance between the respective one of the plurality of terminals and a system ground; and
    a processor operable to determine a particular one of the plurality of sensing channels over which the object is positioned and a position of the object within the particular one of plurality of sensing channels by comparing the signals from the plurality of sensing channels, and
    wherein the processor is further operable to determine the position of the object within the determined particular one of the plurality of sensing channels by a ratiometric analysis of signals taken from the terminals spanning the determined particular one of the plurality of sensing channels, and
    wherein the processor is further operable to subtract a signal taken from a further terminal from each of the signals taken from the terminals spanning the determined particular one of the plurality of sensing channels prior to performing the ratiometric analysis.

2. A capacitive position sensor according to claim 1, wherein the closed sensing path forms a closed loop.

3. A capacitive position sensor according to claim 1, wherein the sensing path is formed by a single resistor.

4. A capacitive position sensor according to claim 1, wherein the closed sensing path has a substantially constant resistance per unit length.

5. A capacitive position sensor according to claim 1, wherein each of the plurality of sensing channels comprises a sampling capacitor connected in series between its terminal and the system ground such that in use each sampling capacitor is supplied with an amount of charge which depends on the capacitance between its terminal and the system ground.

6. A capacitive position sensor according to claim 1, wherein the processor is operable to determine the particular one of the plurality of sensing channels over which the object is positioned by comparing magnitude of the signals.

7. A capacitive position sensor according to claim 1, wherein the processor is operable to provide a position output signal.

8. A capacitive position sensor according to claim 7, wherein the position output signal is provided conditional on the signals from the sensing channels exceeding a threshold.

9. A capacitive position sensor according to claim 1, wherein the processor is operable to provide a status output signal indicative of whether the signals exceed a threshold.

10. A capacitive position sensor according to claim 1, wherein the processor is operable to repeatedly determine position of the object and provide a motion output signal indicative of how the object has moved over the sensing element.

11. A capacitive position sensor according to claim 1, further comprising a wiper that is arranged adjacent to the sensing element, wherein the wiper can be manually actuated to move relative to the sensing path so as to constitute the object to be detected.

12. A capacitive position sensor according to claim 1, further comprising:
a switch controller operable to apply a switching sequence at the plurality of sensing channels, wherein the switching sequence causes a plurality of sampling capacitors associated with respective ones of the plurality of sensing channels to be connected to and then disconnected from a supply voltage and a respective terminal to be subsequently connected to the system ground, and
wherein the switching sequence is repeated until a voltage at each of the plurality of sensing channels is greater than a predefined reference threshold, and
wherein a number of times that the switching sequence is repeated to result in the voltage at a particular one of the plurality of sensing channels to be greater than the predefined reference threshold is used to determine the particular one of the plurality of sensing channels over which the object is positioned.

13. A control panel incorporating a capacitive position sensor for detecting a position of an object comprising;
a single resistive sensing element comprising one continuous resistor that forms a closed sensing path;
a plurality of at least three terminals disposed along the single resistive sensing element at different locations along the closed sensing path, each of the plurality of terminals coupled to a respective one of a plurality of sensing channels;
a plurality of sensing channels that are each connected to a respective one of the plurality of terminals, wherein each sensing channel is operable to generate a signal indicative of capacitance between the respective one of the plurality of terminals and a system ground; and
a processor operable to determine a particular one of the plurality of sensing channels over which the object is positioned and a position of the object within the particular one of plurality of sensing channels by comparing the signals from the plurality of sensing channels, and
wherein the processor is further operable to determine the position of the object within the determined particular one of the plurality of sensing channels by a ratiometric analysis of signals taken from the terminals spanning the determined particular one of the plurality of sensing channels, and
wherein the processor is further operable to subtract a signal taken from a further terminal from each of the signals taken from the terminals spanning the determined particular one of the plurality of sensing channels prior to performing the ratiometric analysis.

14. A control panel according to claim 13, further comprising:
a switch controller operable to apply a switching sequence at the plurality of sensing channels, wherein the switching sequence causes a plurality of sampling capacitors associated with respective ones of the plurality of sensing channels to be connected to and then disconnected from a supply voltage and a respective terminal to be subsequently connected to the system ground, and
wherein the switching sequence is repeated until a voltage at each of the plurality of sensing channels is greater than a predefined reference threshold, and
wherein a number of times that the switching sequence is repeated to result in the voltage at a particular one of the plurality of sensing channels to be greater than the predefined reference threshold is used to determine the particular one of the plurality of sensing channels over which the object is positioned.

15. An apparatus having a control panel incorporating a capacitive position sensor for detecting a position of an object comprising:
a single resistive sensing element comprising one continuous resistor that forms a closed sensing path;
a plurality of at least three terminals disposed along the single resistive sensing element at different locations along the closed sensing path, each of the plurality of terminals coupled to a respective one of a plurality of sensing channels;
a plurality of sensing channels that are each connected to a respective one of the plurality of terminals, wherein each sensing channel is operable to generate a signal indicative of capacitance between the respective one of the plurality of terminals and a system ground; and
a processor operable to determine a particular one of the plurality of sensing channels over which the object is positioned and a position of the object within the particular one of plurality of sensing channels by comparing the signals from the plurality of sensing channels, and
wherein the processor is further operable to determine the position of the object within the determined particular one of the plurality of sensing channels by a ratiometric analysis of signals taken from the terminals spanning the determined particular one of the plurality of sensing channels, and
wherein the processor is further operable to subtract a signal taken from a further terminal from each of the signals taken from the terminals spanning the determined particular one of the plurality of sensing channels prior to performing the ratiometric analysis.

16. An apparatus according to claim 15, further comprising:
a switch controller operable to apply a switching sequence at the plurality of sensing channels, wherein the switching sequence causes a plurality of sampling capacitors associated with respective ones of the plurality of sensing channels to be connected to and then disconnected from a supply voltage and a respective terminal to be subsequently connected to the system ground, and
wherein the switching sequence is repeated until a voltage at each of the plurality of sensing Channels is greater than a predefined reference threshold, and
wherein a number of times that the switching sequence is repeated to result in the voltage at a particular one of the plurality of sensing channels to be greater than the predefined reference threshold is used to determine the particular one of the plurality of sensing channels over which the object is positioned.

* * * * *

UNITED STATES PATENT AND TRADEMARK OFFICE
CERTIFICATE OF CORRECTION

PATENT NO. : 8,643,626 B2
APPLICATION NO. : 13/495158
DATED : February 4, 2014
INVENTOR(S) : Harald Philipp Page 1 of 1

It is certified that error appears in the above-identified patent and that said Letters Patent is hereby corrected as shown below:

On the title page: item (60) Provisional application

After "Aug." and before "2003" delete "12," and insert -- 21, --.

Signed and Sealed this
Seventh Day of October, 2014

Michelle K. Lee
*Deputy Director of the United States Patent and Trademark Office*